United States Patent [19]

Mihelich

[11] Patent Number: 4,797,510
[45] Date of Patent: Jan. 10, 1989

[54] DEVICE FOR JOINING SUPERCONDUCTING WIRE

[75] Inventor: John L. Mihelich, Ann Arbor, Mich.

[73] Assignee: Amax, Inc., New York, N.Y.

[21] Appl. No.: 107,077

[22] Filed: Oct. 13, 1987

[51] Int. Cl.[4] .............................................. H01R 4/68
[52] U.S. Cl. .................................. 174/94 R; 29/599;
29/869; 501/1
[58] Field of Search ............... 174/94 R; 29/599, 868,
29/869

[56] References Cited

U.S. PATENT DOCUMENTS

| 4,126,759 | 11/1978 | Brooks | 174/94 R |
| 4,673,774 | 6/1987 | Wake et al. | 174/94 R |

FOREIGN PATENT DOCUMENTS 8002084 10/1980 PCT Int'l Appl. ................... 29/599

OTHER PUBLICATIONS

Jin, S; et al; High Tc Superconductors–Composite Wire Fabrication; Appl. Phys. Lett.; vol. 51, No. 3; Jul. 20, 87.

Jin, S. et al; Fabrication of Dense $Ba_2YCl_3O_{7-8}$ Superconductor Wire by Molten Oxide Processing; Appl. Phys. Lett. 51(12): Sep. 21, 1987; p. 943.

Yamada, Yutaka ewt al; Bulk and Wire Type Y–Ba–Cu Oxide Superconductor; Proc. I&M Int. Conf. on Low Temperature Physics, Kyoto, 1987; Japanese Journal of Applied Physics; vol. 26 (1987) Supplement 26-3., p. EK31.

Primary Examiner—Morris H. Nimmo
Attorney, Agent, or Firm—Michael A. Ciomek; Eugene J. Kalil

[57] ABSTRACT

A method and product for coupling the ends of a pair of superconducting cored wires are provided, the core of the wires consisting essentially of a substantially unitary structure of a sintered powered superconducting compound material confined within a tubular element of a metal having an electrical conductivity of at least about 20% of that for pure copper taken as unity which metal forms a clad around the core material. The method comprises providing a pair of superconducting cored wires with the cladding material removed from an end of each of the wires to be coupled together to expose a finite length of said core material. A coupling device comprised of a tubular segment of the same metal as the cladding material is used to join the wires together, the tubular segment having disposed therein a green pellet of the superconducting material. The pellet is positioned inwardly from both ends of the tubular segment to allow for entry of the exposed end of the superconducting cored wires. The tubular segment has an internal diameter corresponding substantially to the outside diameter of the cored wires sufficient to provide an interference fit following insertion into the coupling. The exposed ends of the superconducting cored wires to be joined are inserted into the open ends of the tubular coupling device with a rotational force sufficient to effect electrical contact between the ends of the coupled wires and the green pellet and the assembly then subjected to an elevated sintering temperature below the melting point of the clad metal sufficient to sinter the green pellet and effect diffusion bonding between the pellet and the superconducting core material of each of the coupled wires.

8 Claims, 1 Drawing Sheet

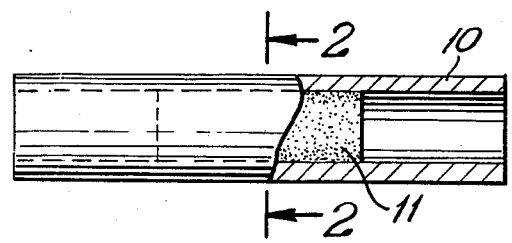
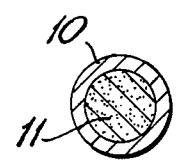
FIG.1  FIG.2
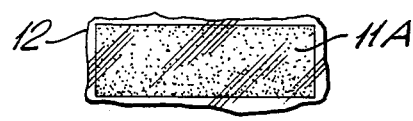
FIG.3
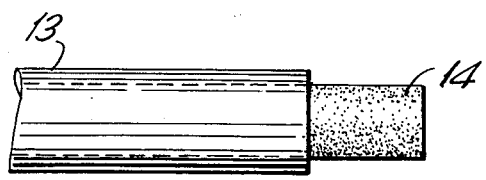
FIG.4
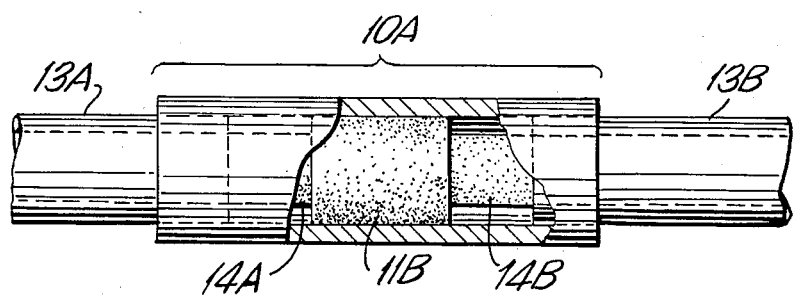
FIG.5

DEVICE FOR JOINING SUPERCONDUCTING WIRE

This invention relates to a device and method for joining superconducting wire.

STATE OF THE ART

Materials are known which are electrically superconductive at very low temperatures approaching absolute zero. The phenomenon of superconductivity occurs when electrical resistance and magnetic permeablility in certain metals disappear at temperatures approaching absolute zero.

However, recent advances in superconductive materials have enabled research scientists to increase the superconductivity transition temperatures to the temperature region of liquid nitrogen (77° K.). Such superconductive materials are metal compound compositions in which at least one of the elements is a non-metallic element, e.g., oxygen. These materials in the compacted and sintered state are quite brittle, particularly metal oxide compositions consisting essentially of barium, at least one rare earth metal from the lanthanide series (atomic Nos. 57–71 including yttrium), copper and oxygen. Upwards of 123 compounds have been determined which include $(LaBaSr)_2CuO_4$ types, among others. Specific examples of superconductive metal oxide compounds are $YBa_2Cu_3O_7$, $LaBa_2Cu_3O_7$ and $HoBa_2Cu_3O_7$. These compounds are particularly useful in that they are superconductive in the temperature region of liquid nitrogen.

Related Application

In my copending application Ser. No. 050,454 filed May 18, 1987, the disclosure of which is incorporated herein by reference, a method is disclosed and claimed for the production of superconducting cored wire which becomes superconductive in the temperature region of liquid nitrogen. The core material is essentially a superconductive metal compound containing at least one non-metallic element, e.g., oxygen.

Examples of superconductive compounds mentioned in the aforementioned application include $YBa_2Cu_3O_7$, $LaBa_2Cu_3O_7$ and $HoBa_2Cu_3O_7$, as well as $(LaBaSr)_2CuO_4$ types. According to the aforementioned copending application, the method disclosed for producing the superconducting core wire resides in the use of a ductile metal in the form of a tubular element or sheath having confined therein a superconductive metal compound of the aforementioned type, the ductile metal having an electrical conductivity of at least 20% of that of pure copper taken as unity.

The tubular element with the superconductive element is then reduced in cross-sectional area of at least about 25% to compact the superconductive compound to at least 80% of its theoretical density and provide a cladded product thereof. This is achieved by drawing the tubular element through a drawing die or by rolling the tubular element. The completion of the method includes thereafter sintering the superconductive compound within the cladded product at an homologous temperature of at least about 50% of the absolute melting range of the superconductive compound material but below the absolute melting point of said ductile metal, whereby an elongated cored superconductive element is provided for use at a transition superconductive temperature specific to the contained superconductive compound material.

The cored wire can be produced in a variety of length. However, there is a limit to how much a continuous length can be produced employing the method disclosed in the copending application.

Thus, in producing large coils of the wire, such as large coils wound on cable drums, it may be necessary to join lengths of the superconductive wires together.

OBJECTS OF THE INVENTION

It is thus an object of the invention to provide a coupling device for joining together the ends of two lengths of a superconducting wire.

Another object is to provide a method for coupling together the ends of adjoining superconducting wires.

These and other objects will more clearly appear when taken in conjunction with the following disclosure, the claims and the accompanying drawing.

THE DRAWING

FIG. 1 is illustrative of one embodiment of a coupling device provided by the invention showing in phantom a "green" or unsintered pellet of a superconductive compound located substantially in the center thereof;

FIG. 2 is cross-section of the coupling device taken along line 2—2 of FIG. 1;

FIG. 3 depicts a green pellet of the core material encapsulated in a rupturable membrane;

FIG. 4 is a view of one end of a typical superconducting length of the core material; and FIG. 5 is an assembly of two ends of a superconducting cored wire coupled together with the cores in electrical contact by means of the pellet in the coupling device.

STATEMENT OF THE INVENTION

One embodiment of the invention resides in a coupling device for joining together at least a pair of superconducting cored wires, the core of the wires consisting essentially of a substantially unitary structure of a sintered superconducting material confined within a tubular element of a metal having an electrical conductivity of at least about 20% of that for pure copper taken as unity, said metal forming a clad around the core material.

The coupling device comprises a tubular segment of the same clad metal as that for the superconducting cored wire, the tubular segment having an internal diameter corresponding substantially to the outside diameter of the sintered core material sufficient for snugly receiving therein an exposed end core portion of the superconducting cored wire. The tubular segment has disposed therein a green or unsintered pellet of the superconducting cored material which may be confined in a rupturable membrane, the pellet being positioned inwardly from both ends of the tubular element to allow for entry at each end thereof of an exposed end portion of a superconducting cored wire and thereby provide a coupling therefor.

The invention is also directed to a method for coupling the ends of a pair of superconducting cored wires, the core of the wires as stated above, consisting essentially of a substantially unitary structure of a sintered powdered superconducting material confined within a tubular element of a ductile metal having an electrical conductivity of at least about 20% of that for pure copper taken as unity, the ductile metal forming a clad around the core material as described in U.S. patent application Ser. No. 050,454.

The method comprises providing a pair of superconducting cored wires with the cladding material removed from an end of each of the wires to be coupled together to expose a finite length of the sintered core material; and providing as a coupling member a tubular segment of the same metal as the cladding material of the superconducting cored wires to be joined having disposed therein a green pellet of the superconducting material which may or may not be confined in a rupturable membrane.

The pellet is positioned inwardly from both ends of the tubular segment to allow for entry of the exposed end of the superconducting cored wires, the tubular segment having an internal diameter corresponding substantially to the outside diameter of the sintered core material sufficient for snugly receiving the exposed end of each of the cladded cored wires at each end thereof.

The exposed ends of the superconducting cored wires to be joined are inserted into the open ends of the tubular coupling with a force sufficient to contact the green pellet or to rupture the membrane confining the green pellet, if used, and effect electrical contact between the ends of the coupled wires and said green pellet, following which the cored wires are subjected to an elevated temperature sufficient to sinter the green pellet and effect diffusion bonding between the pellet and the superconducting core material of each of the coupled wires inserted therein and thereby form a continuous joint.

DETAILS OF THE INVENTION

As stated hereinabove, the invention is particularly applicable in joining together superconducting cored wires in which the core material is a powdered superconducting metal oxide compound which is compacted within a tubular element and thereafter sintered in situ to provide a core having a unitary structure.

The coupling employed in producing continuous lengths of the core wire is depicted in FIGS. 1 and 2 as comprising a tubular segment 10 having disposed within it a green pellet 11 of the superconductive core material.

By "green pellet" is meant a compressed powder of the superconducting metal oxide compound in the unsintered state. Preferably, the green pellet is encapsulated within a lightweight polymer sack or rupturable membrane, such as polyvinyl chloride (PVC) or in a gelatin capsule.

The green pellet 11A is shown in FIG. 3 encapsulated in a rupturable membrane 12 of polyvinyl chloride. However, a rupturable membrane is not necessary (and in some instances may be undesirable) so long as the pellet has sufficient green strength to enable handling thereof.

In producing the joint, one end of the sheath 13 covering the superconducting core 14 (FIG. 4) is carefully removed, e.g., by machining or by chemical means, to expose a finite length of the sintered solid cored material 14, the external diameter thereof corresponding substantially to the I.D. (internal diameter) of the tubular coupling, the external diameter of the core being sufficient to provide an interference fit into the I.D. of the coupling. This may be achieved by inserting the exposed end of the cored wire into the coupling while rotating the coupling slightly to force the exposed solid superconductive core into the coupling and in contact with the green pellet. Where the pellet is encapsulated in a membrane the force is such as to rupture the membrane and effect electrical contact between the exposed solid core and the green pellet.

The cored wire/coupling assembly is depicted in FIG. 5. The coupling 10A is shown containing green pellet 11B in approximately the center thereof, with cored wires 13A, 13B inserted, respectively, into each end of the coupling with core 14A of wire 13A contacting green pellet on one side thereof and core 14B of wire 13B contacting the green pellet on the other side thereof, thereby forming a continuous joint. The I.D. of the coupling is substantially the same as the O.D. of cored wire and is sufficient to provide an interference fit.

Following assembly of the cored wire and the coupling as described hereinabove, the assembled joint is then subjected to a sintering temperature, for example, in a portable sintering furnace. The pellet in the joint is sintered at an homologous temperature of at least about 50% of the absolute melting range of the superconductive compound material, preferably at least about 60%, e.g., 70% and above, but below the absolute melting point of the ductile metal employed as the tubular element of the wire and the melting point of the tubular segment constituting the coupling device. The I.D. of the metal sheath may be coated with a more noble metal, such as silver, to prevent reduction of the superconductive oxide.

The superconductive metal compound in the coupling device is similar or the same as that used as the core material in the wire. The preferred compound is one that consists essentially of barium, a rare earth metal from the lanthanide series including yttrium, copper and oxygen, which exhibits superconductivity at temperatures substantially above absolute zero and in the neighborhood of the temperature of liquid nitrogen. As stated hereinabove, examples of such compounds are $YBa_2Cu_3O_7$, $LaBa_2Cu_3O_7$ and $HoBa_2Cu_3O_7$. In addition there are the $(LaBaSr)_2CuO_4$ types of compounds.

The ductile material employed for the wire and the coupling includes metals selected from the group consisting of copper, silver, aluminum, molybdenum and tungsten.

As illustrative of the invention, the following examples are given:

EXAMPLE 1

Two lengths of superconducting cored wires comprising copper tubes having confined therein compacted sintered superconducting core material of $YBa_2Cu_3O_7$ are prepared for joining as follows.

A portion of the copper tubing at one end of each of the wires of 0.062 inch O.D. is removed to expose a finite length of the solid sintered core material, each of the exposed lengths being about 0.125 inch long and having a diameter of about 0.044 wire.

A coupling device is provided formed of a tubular segment of copper with an O.D. of 0.08 inch and an I.D. of about 0.062 inch. A green pellet of the same core material of about 0.50 inch long and 0.062 inch in diameter is disposed therein in substantially the center portion of the tubular segment.

The exposed end of one of the wires is inserted into one end of the coupling device and the exposed end of the other wire is inserted into the other end to provide an assembly thereof as illustrated in FIG. 5. The insertion is accompanied by a slight rotating force to assure a good interference fit of the O.D. of the cored wire into the I.D. of the coupling. The fitting is considered complete when the exposed ends of each of the wires are forced against or penetrate the green pellet and thus provide a joint therewith.

The joint portion is then subjected to a sintering temperature for the green pellet. $YBa_2Cu_3O_7$ has a softening point in the neighborhood of about 1250° C. or 1523° K. The temPerature selected is about 75% to 80% of the absolute softening point of the core material, or about 925° C. The copper coupling has a melting point of about 1083° C. and the diffusion barrier of silver has a melting point of 961° C. The temperature of 925° C. is sufficient to provide a strong joint and to assure diffusion bonding between the pellet in the joint and the core material of the wires.

EXAMPLE 2

Similar joints may be produced where the superconducting compound is $HoBa_2Cu_3O_7$. The tubing may comprise aluminum which has an electrical conductivity of about ½ that of copper and a melting point of about 660° C. The sintering temperature for the joint may range from about 485° C. to 550° C.

EXAMPLE 3

A further example of a joint is one in which molybdenum tubing is used to make the superconducting cored wire, wherein the superconducting core material is $LaBa_2Cu_3O_7$. The molybdenum has an electrical conductivity of about ⅓ of that for copper and a melting point of 2610° C. In producing the joint, the sintering temperature may range from about 800° C. to 950° C. or higher.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and the appended claims.

What is claimed is:

1. A coupling device for joining together at least a pair of superconducting cored wires, the core of each wire consisting essentially of a substantially unitary structure of a sintered superconducting material, each core being confined within a tubular element of a metal having an electrical conductivity of at least about 20% of that for pure copper taken as unity, said metal forming a cladding around each core, said coupling device comprising:
a tubular segment of the same clad metal as said superconducting cored wires,
said tubular segment having an internal diameter (I.D.) corresponding substantially to the outside diameter (O.D.) of said cored wires sufficient for receiving an exposed end core portion of said uperconducting cored wire and providing an interference fit with the O.D. thereof,
said tubular segment having disposed therein a green pellet of the same material as said superconducting material, and
said pellet being positioned inwardly from both ends of said tubular element to allow for entry at each end thereof of an exposed end portion of a superconducting cored wire to be joined and thereby provide a coupling therefor.

2. The coupling device as in claim 1, wherein the tubular metal for both of the superconducting cored wires and the coupling device is selected from the group consisting of copper, silver, aluminum, molybdenum and tungsten, and wherein the superconducting material consists essentially of barium, a rare earth metal from the lanthanide series including yttrium, copper and oxygen.

3. The coupling device as in claim 2, wherein the ductile metal of the coupling is copper and wherein the superconducting material forming the green pellet is selected from the group consisting of $YBa_2Cu_3O_7$, $LaBa_2Cu_3O_7$, $HoBa_2Cu_3O_7$, and $(LaBaSr)_2CuO_4$ types of compounds.

4. The coupling device as in claim 3, wherein the green pellet is encapsulated within a rupturable membrane.

5. A method for coupling the ends of a pair of superconducting cored wires, the core of each wire consisting essentially of a substantially unitary structure of a sintered powdered superconducting compound material confined within a tubular element of a metal having an electrical conductivity of at least about 20% of that for pure copper taken as unity, said metal forming a cladding around the core material which comprises:
providing a pair of superconducting cored wires with the cladding removed from an end of each of the wires to be coupled together to expose a finite length of said core material,
providing as a coupling device a tubular segment of the same metal as the cladding of said superconducting cored wires to be joined, said tubular segment having disposed therein a green pellet of the same material as said superconducting compound material,
said pellet being positioned inwardly from both ends of said tubular segment to allow for entry of the exposed ends the superconducting cored wires, said tubular segment having an internal diameter (I.D.) corresponding substantially to the outside, diameter (O.D.) of said cored wires sufficient to provide an interference fit with the O.D. of the cored wires,
inserting the exposed ends of the superconducting cored wires to be joined into the open ends of the tubular coupling device with a rotational force sufficient to effect electrical contact between the ends of the wires and said green pellet,
and then subjecting the exposed end of said cored wires and said green pellet to an elevated sintering temperature below the melting point of the clad metal sufficient to sinter said green pellet and effect diffusion bonding between the pellet and the superconducting core material of each of the wires.

6. The method as in claim 5, wherein the tubular metal for of the superconducting cored wires and the coupling device is selected from the group consisting of copper, silver, aluminum, molybdenum and tungsten, and wherein the superconducting compound material consists essentially of barium, a rare earth metal from the lanthanide series including yttrium, copper and oxygen.

7. The method as in claim 6, wherein the metal of the coupling is copper and wherein the superconducting compound material forming the green pellet is selected from the group consisting of $YBa_2Cu_3O_7$, $LaBa_2Cu_3O_7$ and $HoBa_2Cu_3O_7$.

8. The method as in claim 7, wherein the green pellet in the coupling device is encapsulated in a rupturable membrane prior to inserting the exposed ends of the superconducting cored wires to be joined into the open ends of the coupling device.

* * * * *